United States Patent [19]
Wilman et al.

[11] Patent Number: 5,912,557
[45] Date of Patent: Jun. 15, 1999

[54] CENTRIC PHASE ENCODING ORDER FOR 3D NMR DATA ACQUISITION

[75] Inventors: Alan H. Wilman; Stephen J. Riederer, both of Rochester, Minn.

[73] Assignee: Mayo Foundation for Medical Education and Research, Rochester, Minn.

[21] Appl. No.: 08/801,226

[22] Filed: Feb. 19, 1997

[51] Int. Cl.[6] .................................................. G01V 3/00
[52] U.S. Cl. ........................................... 324/309; 324/307
[58] Field of Search .................................... 324/309, 307, 324/314, 312, 300

[56] References Cited

U.S. PATENT DOCUMENTS

| 5,122,747 | 6/1992 | Riederer et al. | 324/309 |
| 5,758,646 | 6/1998 | Van Der Meulen et al. | 324/309 |

*Primary Examiner*—Louis Arana
*Attorney, Agent, or Firm*—Quarles & Brady, LLP

[57] ABSTRACT

A 3DFT NMR scan is performed by stepping two phase encoding gradients through a sequence of values to sample all locations in k-space. The gradients are stepped such that k-space is covered by sampling closer to the origin of k-space first. Two methods for ordering the k-space sample points are disclosed.

3 Claims, 6 Drawing Sheets

CENTRIC PHASE ENCODING ORDER FOR 3D NMR DATA ACQUISITION

STATEMENT REGARDING FEDERALLY SPONSORED RESEARCH

This invention was made with government support under grants 2 RO1 CA37933 and 2 RO1 HL37310 awarded by the National Institutes of Health to Mayo Foundation For Medical Education Research, and the United States Government has certain rights in this invention.

BACKGROUND OF THE INVENTION

The field of the invention is nuclear magnetic resonance imaging methods and systems. More particularly, the invention relates to the acquisition of three-dimensional NMR data from which images may be reconstructed.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The present invention will be described in detail with reference to a variant of the well known Fourier transform (FT) imaging technique, which is frequently referred to as "spin-warp". The spin-warp technique is discussed in an article entitled "Spin Warp NMR Imaging and Applications to Human Whole-Body Imaging" by W. A. Edelstein et al., *Physics in Medicine and Biology,* Vol. 25, pp. 751–756 (1980). It employs a variable amplitude phase encoding magnetic field gradient pulse prior to the acquisition of NXR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed.

The use of three-dimensional versions of the spin-warp method (3DFT) is finding wider use in clinical applications. In the 3DFT implementation spatial information is encoded in two directions by applying phase encoding gradients along both directions and acquiring the NMR signal in the presence of a readout gradient along the third direction. In a typical 3DFT scan, one of the phase encoding gradients (eg. $G_z$) is stepped through all its values, and for each $G_z$ step, the other phase encoding gradient (eg. $G_y$) is stepped through all its values. Such a scan is depicted in FIG. 2 where it can be observed that the sampling starts in one corner of "k-space" and finishes in the opposite corner.

In a number of 3DFT clinical applications it is important to acquire the NMR data at a critical moment. For example, in dynamic studies a contrast agent is injected and image contrast is enhanced if the important phase encoding views are acquired when the contrast agent passes through the vasculature of interest. Similarly, preparation techniques such as inversion recovery sequences for suppressing background signal rely on the timing of the NMR data acquisition. Since 3DFT scans require considerable time to acquire all the phase encoding views needed for an image reconstruction, methods must be used in which some of the NMR data is acquired under less than ideal circumstances.

The centric view ordering described in U.S. Pat. No. 5,122,747 is the solution to this timing problem. As illustrated in FIG. 3, centric view ordering scans k-space in a spiral pattern starting at the center of k-space and working outward. Since the central views contain the majority of structural information about the object, these central views are acquired at the optimal moment during the procedure and the peripheral views are acquired later. In FIG. 3, equal y-axis and z-axis fields of view are assumed and hence the spacings $\Delta k_y$ and $\Delta k_z$ between samples are equal. Because of this equal spacing, the sampling path is a square spiral from which this phase encoding scheme takes its name.

In most clinical applications the fields of view along the two phase encoding axes are far from the same. Typically, the field of view along one axis may be on the order of eight times the field of view along the other axis. This situation is illustrated in FIG. 4 where the field of view is eight times smaller in the z direction than in the y direction, representing, for example, a 256×32 (y×z) acquisition with equal y and z resolution. The circle encloses the most central 16 phase encoding views as determined by k-space magnitude. It is these views which contribute most to the reconstructed image, and it is these views that should be acquired first. However, with the spiral scan the order in which the views are acquired (indicated by numbers next to each k-space sample point) give too high weighting to sample points along the smaller field of view direction and too low weighting to those along the larger field of view direction. For example, the k-space sample points acquired 60th and 61st in the spiral scan lie much closer to the k-space origin than the k-space samples acquired 5th and 6th during the scan. The improved image quality produced by centric view ordering is thus diminished considerably when unequal fields of view are acquired in the phase encoding directions.

SUMMARY OF THE INVENTION

The present invention is a method for producing an NMR image from an NMR data set that is acquired by sampling k-space in a specific manner. More specifically, the present invention includes inputting the desired fields of view of an image along two dimensions, producing an array of k-space sample points along the two dimensions which will produce the desired fields of view in a reconstructed image, ordering the k-space sample points in the array such that the sample points closer to the origin of k-space are listed first, acquiring an NMR data set using a pulse sequence in which two phase encoding gradients are stepped through values to sample k-space in the listed order, and reconstructing an image from the acquired NMR data set.

A general object of the invention is to scan k-space beginning at the origin and working radially outward therefrom regardless of the selected fields of view. Rather than spiralling through the required sample points in a fixed manner as taught by the prior art, the sample points are sorted into an order which insures sampling is conducted in the proper order. In one embodiment the distance of each sample point from the origin of k-space is calculated and the samples are sorted based on this distance. In another embodiment, the required k-space sample points are referenced to a master array in which the proper sampling order is known to determine the proper order for conducting the scan. Sampling is performed in the optimal order regardless of the particular fields of view chosen.

DESCRIPTION OF THE PREFERRED EMBODIMENT

Figure 1:
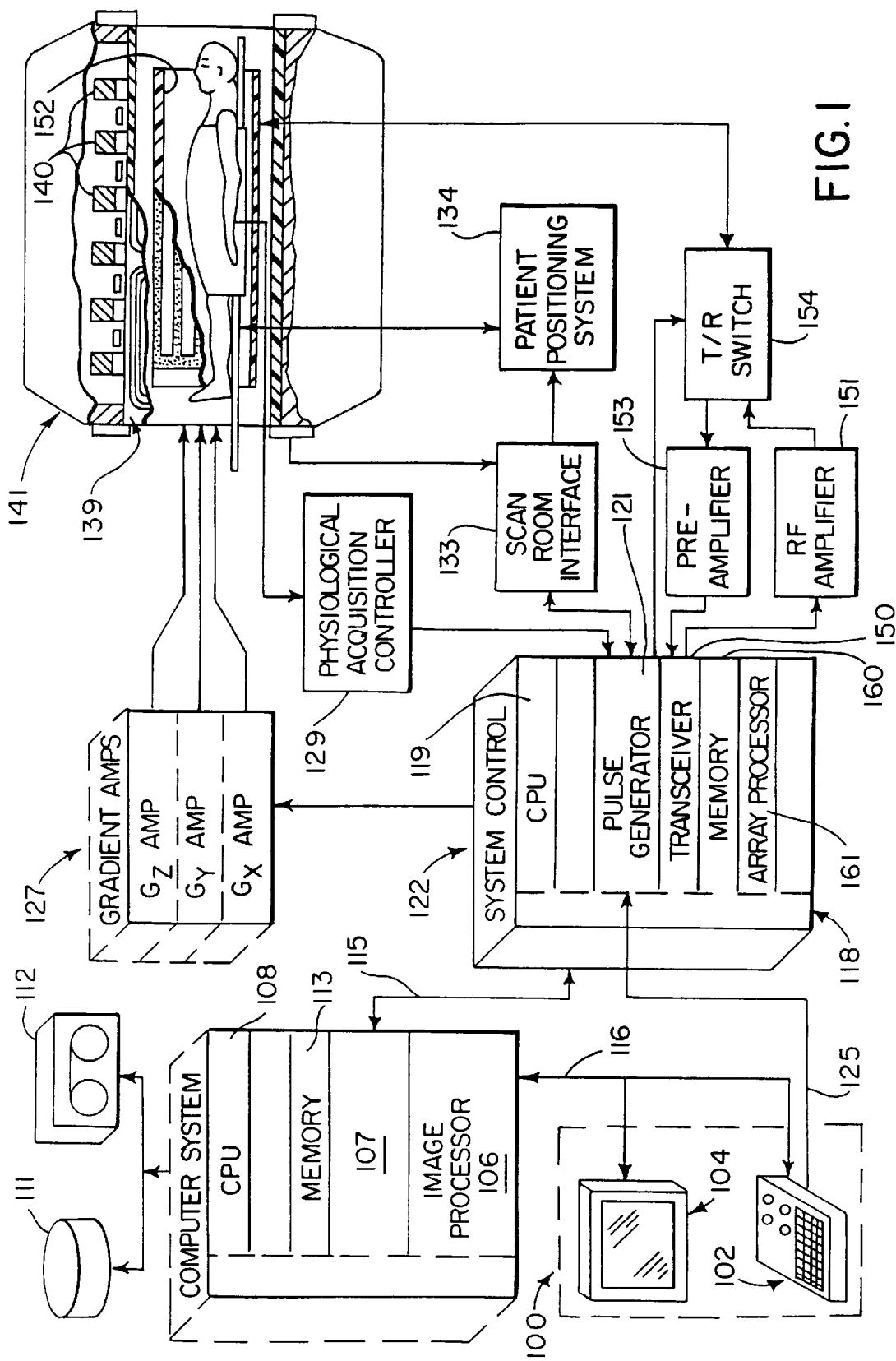
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

For a more detailed description of the transceiver 150, reference is made to U.S. Pat. Nos. 4,952,877 and 4,992,736 which are incorporated herein by reference.

Figure 5:
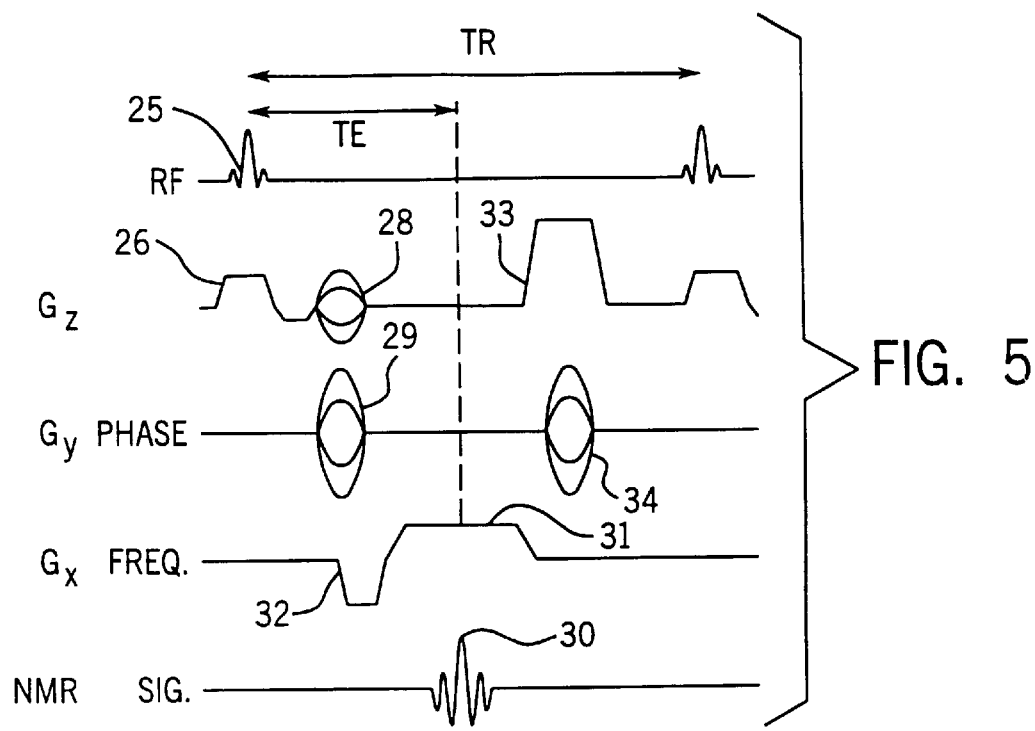
FIG. 5 is a graphic representation of a 3DFT pulse sequence employed by the MRI system of FIG. 1 in performing the preferred embodiment of the invention.

The NMR system of FIG. 1 performs a series of pulse sequences to collect sufficient NMR data to reconstruct an image. Referring particularly to FIG. 5, an exemplary pulse sequence for conducting a 3 DFT NMR scan is shown. The pulse sequence commences by the selective excitation of the entire region of interest with an RF excitation pulse 25 in the presence of a slab select $G_z$ gradient pulse 26. The frequency content of the excitation pulse 25 and the amplitude of the slab select $G_z$ pulse 26 are selected to produce transverse magnetization in the region which is the subject of the 3D scan. A negative $G_z$ pulse 27 is then produced to rephase the spins in preparation for the phase encoding and readout.

Phase encoding is performed along two axes: the z-axis and the y-axis. The z-axis encoding is accomplished by applying a $G_z$ phase encoding pulse 28 and the y-axis encoding is accomplished by applying a $G_y$ phase encoding pulse 29. As is well-known to those skilled in the art, the magnitude of the phase encoding pulses 28 and 29 are stepped through a series of positive and negative values during the scan, but each is set to one value during each pulse sequence. As will be described in detail below, it is the order in which these phase encoding pulses 28 and 29 are stepped through their set of values which is the subject of the present invention. As is well-known in the art, the magnitude of a phase encoding gradient pulse is determined by the integral of its amplitude over its duration (i.e. its area). In most pulse sequences the duration is kept constant and the phase encoding pulse magnitude is stepped through its values by changing its amplitude.

After phase encoding the transverse magnetization, the NMR signal 30 is read-out in the presence of a $G_x$ read-out gradient 31. This read-out is preceded by a negative $G_x$ gradient pulse 32 to produce the gradient refocused NMR echo signal 30 in the usual fashion. The 3DFT pulse sequence is then concluded by the application of a large $G_z$ spoiler gradient pulse 33 and a $G_y$ rewinder gradient pulse 34 to prepare the magnetization for the next pulse sequence which follows immediately. As is known to those skilled in the art, the spoiler pulse 33 dephases transverse magnetization and the rewinder pulse 34 refocuses transverse magnetization along the y-axis in preparation for the next pulse sequence. The rewinder pulse 34 is equal in magnitude, but opposite in polarity with the $G_y$ phase encoding pulse 29.

The acquisition of data in 3DFT scanning can be considered sampling of a three-dimensional "k-space". Two of the dimensions, $k_y$ and $k_z$, are sampled by applying different phase encoding gradients $G_y$ and $G_z$ during each pulse sequence of the scan, and each acquired NMR signal contains 256 samples along a line in the $k_x$ direction. The pulse sequence is repeated for as many repetitions as are necessary to sample all desired $k_y$ and $k_z$ values. For example, $k_y$ may assume 128 different values and $k_z$ may have 64 values. In this case the number of repetitions of the pulse sequence of FIG. 3 would be 128×64 or 8192.

Figure 2:
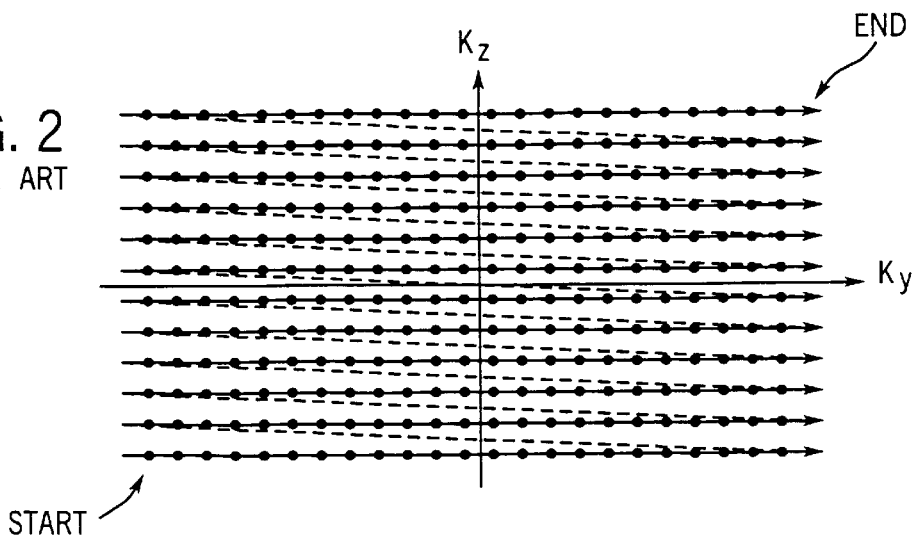
FIG. 2 is a graphic representation of a conventional scan of k-space during a typical 3DFT acquisition using the MRI system of FIG. 1.

With conventional 3DFT scanning the desired values of $k_y$ and $k_z$ are sampled with two nested loops. For example, the inner loop increments $k_y$ through its 128 values and after all such samples have been made for a given value of $k_z$, the outer loop increments $k_z$. This process continues until all 128 values of $k_y$ have been sampled at each of the 64 values of $k_z$. A diagram of this prior art process is shown in FIG. 2, where the vertical axis indicates the sample along $k_z$ produced by the magnitude of the $G_z$ phase encoding pulse, and the horizontal axis indicates the sample along $k_y$ produced by the magnitude of the $G_y$ phase encoding pulse. The arrow shows the temporal trajectory through ($k_y$, $k_z$) space of the sampling during the scan. The sampling starts in the lower left corner with negative $k_y$ and $k_z$ samples, and ends at the upper right corner with positive $k_y$ and $k_z$ samples. In this conventional scan, therefore, ($k_y$, $k_z$) space is scanned in much the same way as a television screen is scanned.

Figure 3:
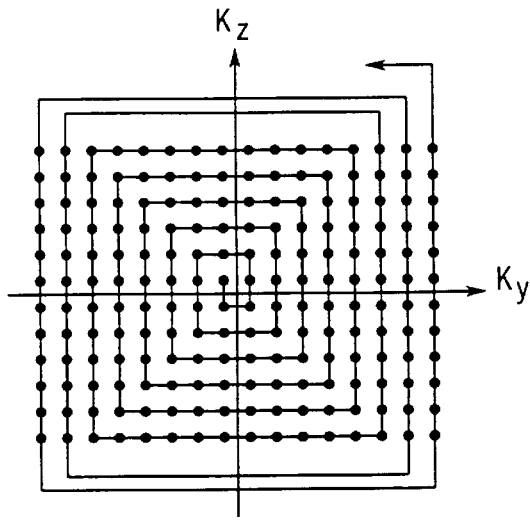
FIG. 3 is a graphic representation of a centric view ordering of a scan of k-space using the MRI system of FIG. 1.

Centric view ordering is based on the realization that for most objects the bulk of the signal power is contained in the samples taken near the origin of ($k_y$, $k_z$) space, and it is these samples which contribute most significantly to the appearance of the reconstructed image. This results from the fact that the NMR signals acquired during the scan are Fourier transformed along the $k_x$, $k_y$ and $k_z$ directions to produce intensity values for an image in real (x,y,z) space. It is the nature of this transformation that the samples near the origin ($k_y=0$, $k_z=0$) contribute a disproportionate share to the signal power of the reconstructed image. Accordingly, it is a basic idea of centric view ordering to sample the ($k_y$, $k_z$) points which contain the most signal power in as short a time and as close to the beginning of the scan as possible. This can be done by modifying the trajectory with which the ($k_y$, $k_z$) space is sampled. Specifically, a square spiral ($k_y$, $k_z$) trajectory, such as that shown in FIG. 3 is used. The scan starts at or near the origin of ($k_y$, $k_z$) space and progressively works its way outward in a spiral fashion. In FIG. 3, a 12×16 array of k-space samples are acquired, but this is only illustrative, since in practice many more samples are usually acquired to cover the field of view with adequate resolution. The manner in which the values of the $G_y$ and $G_z$ phase encoding gradients are stepped to accomplish a spiral trajectory scan is shown in U.S. Pat. No. 5,122,747.

In addition to the fact that this spiral k-space trajectory is itself less susceptible to motion effects, it also enhances other motion reduction techniques. For example, a breath hold for the first 10 seconds of the scan to acquire the center 10% of k-space with no motion is easily achievable. The patient can resume breathing during the remainder of the scan when the peripheral regions of k-space are acquired. Similarly, gating can be used during the early part of the spiral scan to minimize motion artifacts, and the gating can be eliminated during the later part of the spiral scan when motion has less detrimental effects on the reconstructed image. In other words, the scan time is degraded by gating only during the initial 10% of the samples.

Figure 6:
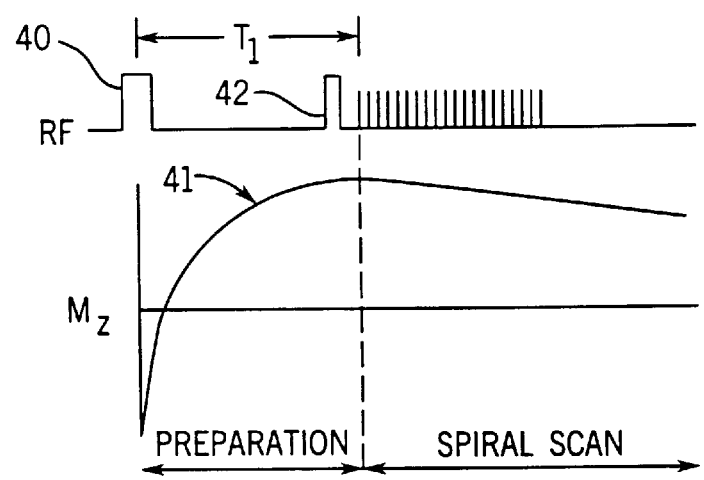
FIG. 6 is a graphic representation of a scan according to the present invention preceded by a contrast enhancement preparation pulse.

The square spiral trajectory is also useful in 3D fast imaging sequences that employ a "preparatory phase" to control image contrast. In these methods, one or more pulses are applied to prepare the magnetization before data acquisition begins. Such a scan is shown in FIG. 6 where a 180° F. excitation pulse 40 is applied during the preparation phase, and at a time interval $T_1$ thereafter, the spiral scan is begun when the magnetization $M_z$ indicated at 41 is at a maximum. Immediately before the spiral scan is started a saturation RF pulse 42 is applied which is tuned to suppress the signal from fat spins. The prepared magnetization decays as data acquisition proceeds so that the desired contrast fades during the scan. By using the spiral k-space scan, however, the central region of k-space is acquired quickly while the contrast is maximum, and these acquired signals contribute more strongly to the resulting image.

The present invention is an improvement to the centric view ordering that insures k-space is scanned from the origin of k-space outward, regardless of the particular fields of view chosen. This is accomplished by separating the spiral scanning idea from the particular array of k-space samples that are to be acquired. As indicated above, the array of k-space samples required for a particular image is dictated by the fields of view along each image axis. Spiralling through such an array of required sample points corresponds to spiralling through k-space only in the unique situation in which the fields of view along both axes are equal. That is not the case in most clinical MRI situations.

Figure 4:
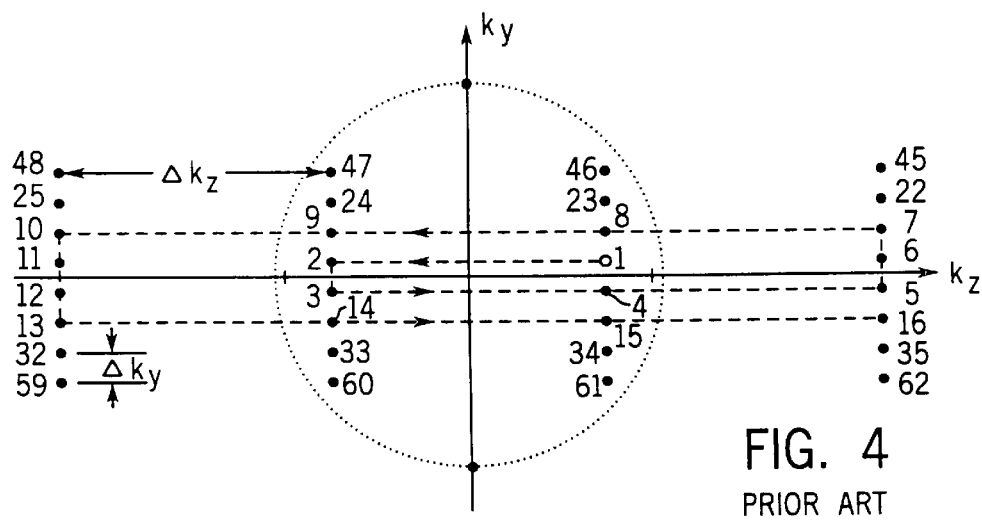
FIG. 4 is a graphic representation of a centric view ordering scan of k-space when the field of view along one phase encoding axis is much smaller than the field of view along the other phase encoding axis.
Figure 7:
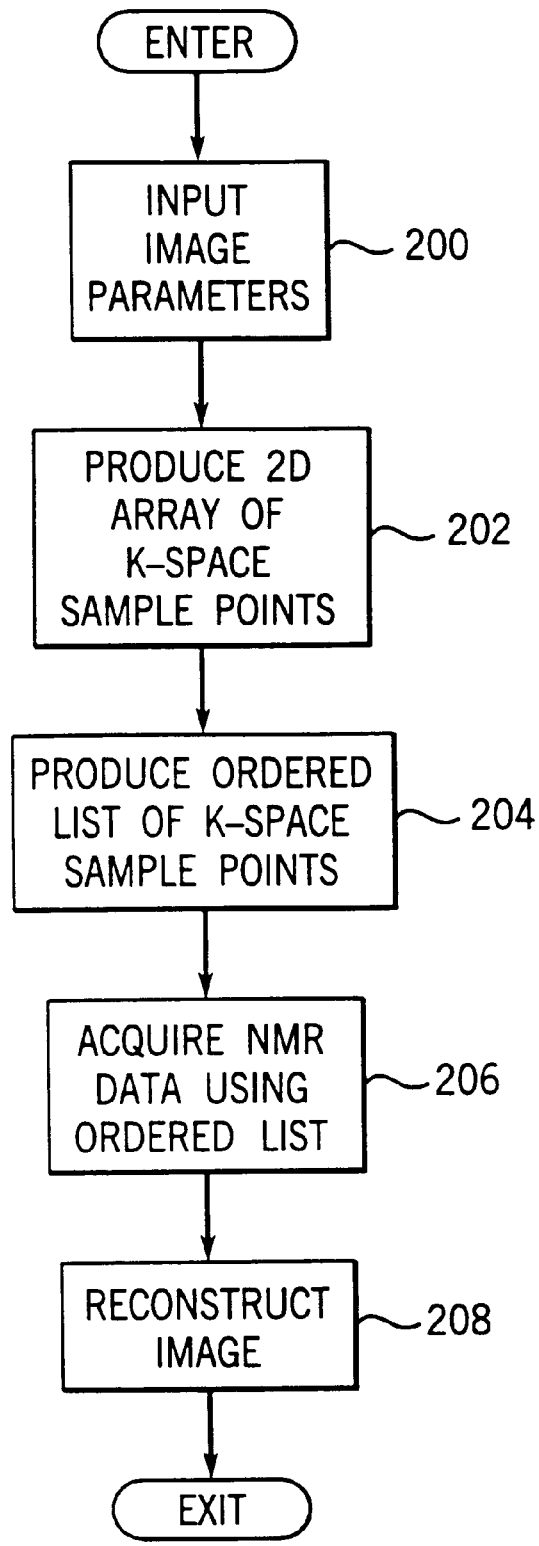
FIG. 7 is a flow chart illustrating the steps performed by the MRI system of FIG. 1 in practicing the present invention.

The present invention is practiced by performing a scan with the MRI system of FIG. 1 using the sequence of steps shown in FIG. 7. As indicated by process block 200, the first step is to input the various parameters that prescribe the image to be produced. These include the fields of view along each phase encoding axis y and z as well as the resolution along these axes. Based on these parameters a 2D array of k-space sample points is produced as indicated by process block 202. Such an array of sample points may look like that in FIG. 3 when the fields of view along the y and z axis are the same, or it may look like that in FIG. 4 when the fields of view are significantly different.

The next step, as indicated by process block 204 is to rank, or sort, the k-space sample points in this 2D array to produce an ordered list of k-space sample points. Two specific methods for accomplishing this will be described below, but in general, the objective is to rank each k-space sample point according to its distance from the origin of k-space. The closer points are ranked higher and appear earlier on the ordered list. As indicated by process block 206, the NMR data is then acquired using the prescribed pulse sequence with a view order that is determined by this ordered list of k-space sample points. When the acquisition is completed, an image is reconstructed as indicated by process block 208.

Figure 8A:
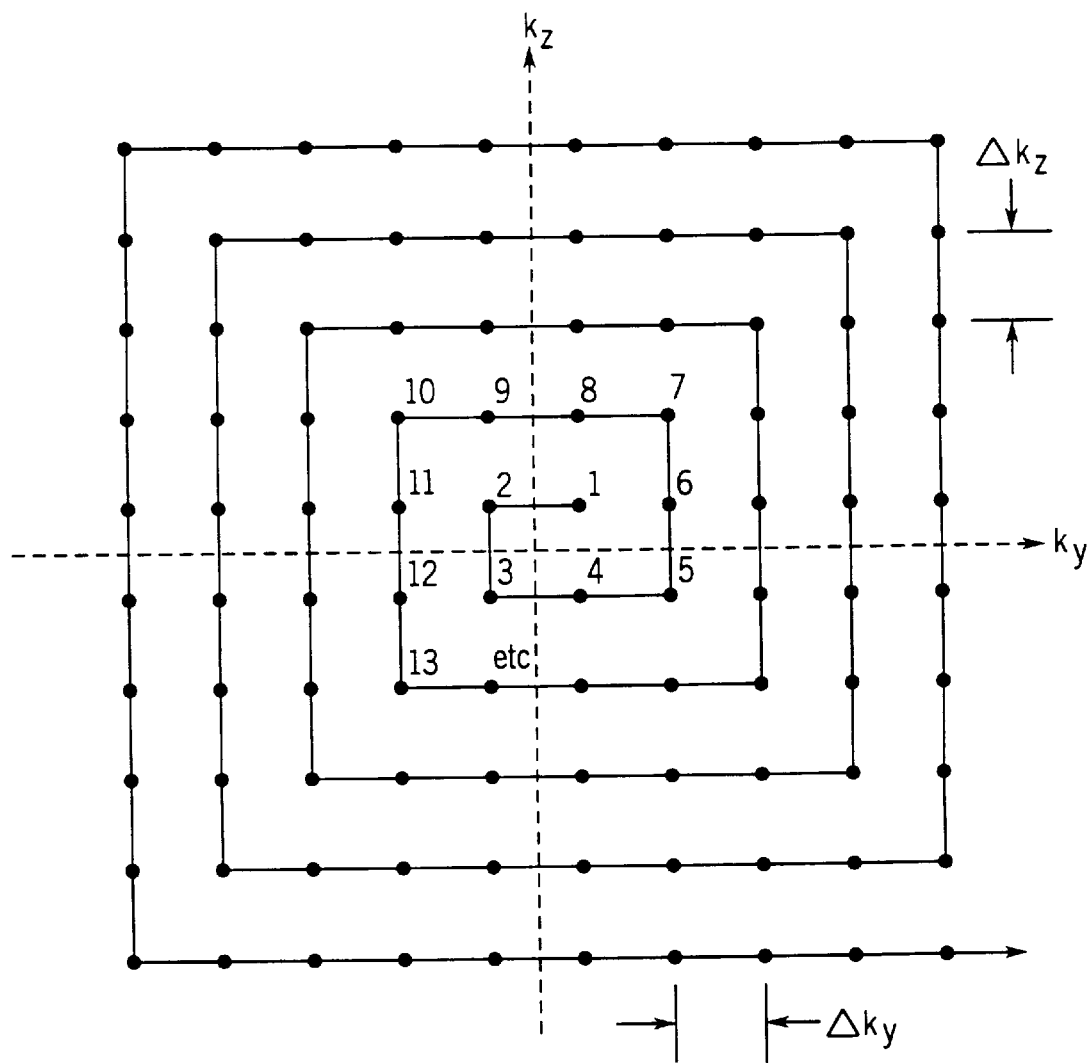
FIGS. 8A and 8B are graphic illustrations of master arrays determined in accordance with the teachings of the present invention.

The first method for ranking k-space sample points and producing the ordered list employs a "master" array that is shown schematically in FIG. 8a. The master array represents a 256 by 256 array of k-space sample points. It corresponds to the highest resolution, largest field of view image that can be specified along the y and z axes. Any specified image will require sample points that correspond to a subset of the sample points in this master array. The spacing of the sample points in master array (i.e. $\Delta k_y$ and $\Delta k_z$) is the same along both axes, and as shown in FIG. 8a, the sample points in the master array are ranked in a square spiral pattern starting with a sample point "1" closest to the origin of k-space.

Figure 8B:
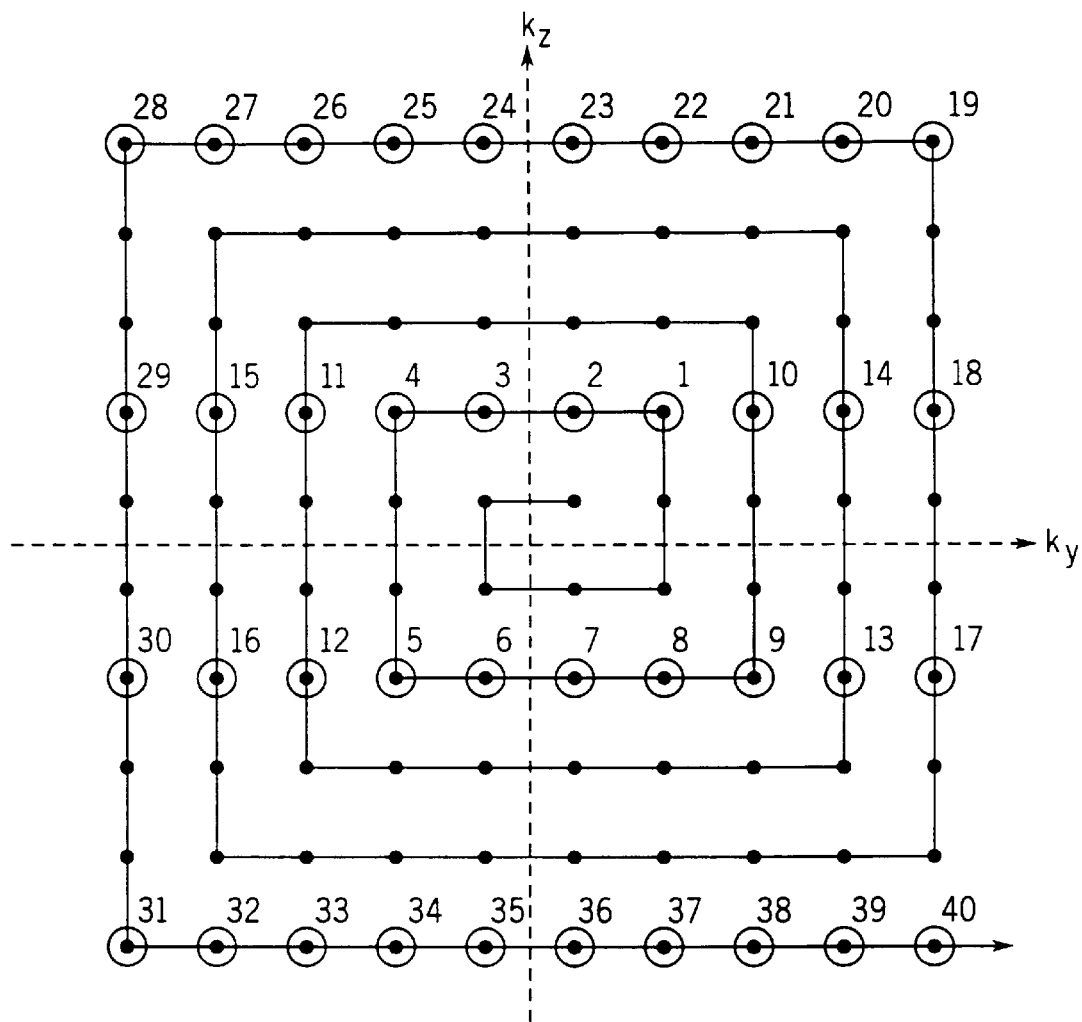

The points in the 2D array of k-space sample points are ranked by determining the rank of their corresponding sample points in the master array. This is illustrated in FIG. 8B where the "dots" illustrate the sample points in the master array and the "circles" illustrate corresponding sample points in the 2D array to be ranked. As indicated by the numbers, the sample points in the 2D array are ranked by the order in which they are reached as one spirals outward in the master array, as shown by the solid lines. Thus, as each k-space sample point located, it is assigned a rank determined by the rank of its corresponding point in the master array. These assigned ranks are then sorted to determine the proper view order according to the present invention.

A second method for producing the ordered list of sample points is based on the distance of the sample point from the origin of k-space. First, we assume that the field of view along y is FOV and that the field of view along z is some fraction of this, FOV/N The $k_y$ values which are to be sampled in the phase encoding process are $+1/(2\ FOV)$, $\pm 3/(2\ FOV)$, $\pm 5/(2\ FOV)$, ..., $\pm m/(2\ FOV)$, where 2 m is the total number of $k_y$ phase encodes desired. This assumes that the $k_y$ origin is not sampled and the smallest nonzero $k_y$ spatial frequencies sampled are at $\pm 1/(2\ FOV)$. Similarly the $k_z$ values which are to be sampled are $\pm N/(2\ FOV)$, $\pm 3N/(2\ FOV)$, $\pm 5N/(2\ FOV)$, ..., $\pm N/(2\ FOV)$, where 2 n is the total number of $k_z$ phase encodes. All phase encodings to be sampled can then be characterized by the index (i,j), where $-m \leq i \leq m$ and $-n \leq j \leq +n$ and i and j assume nonzero integer values. The distance from the k-space origin to the sample point is characterized by the indices (ij) and is equal to $(1/FOV)\ \mathrm{sqrt}\ \{[2|i|-1]^2 + N^2[2|j|-1]^2\}$ where "sqrt" denotes the operation of taking the square root and |*| denotes the absolute value of *. Once the distance is determined for all k-space sample points (i,j), the points are ranked on the basis of their respective distances with the point having the smallest distance being ranked first. In this way, the ordered list of desired phase encodings, or views, is determined.

It has been assumed thus far that the subject phase encoding orders are used in the situation in which all encodings are acquired in a single cycle of the MR image acquisition. However, the subject encoding orders can also be modified for situations in which not all of the phase encodings are read out in one cycle of the MR image acquisition. This case in which some subset of views is read out in each of several acquisition cycles is often referred to as a "segmented" acquisition. Segmentation might be applied, for example, if data acquisition is to be performed over some limited phase of the cardiac cycle which is so small that not all desired phase encodings can be acquired. In this case the acquisition of all requisite views would be performed over multiple cardiac cycles. The advantages of the subject phase encoding view orders can be preserved on a segment by segment basis by reading out the phase encodings within each segment in a manner which maintains the teachings of the nonsegmented approach. One specific way to do this is as follows. Suppose that the phase encodings desired for the complete unsegmented acquisition are identified and ranked using either of the two methods described above. Also suppose that the number of acquisition cycles or segments is N. Then in the first segment the phase encoding views would be applied in the order of 1, N+1, 2N+1, 3N+1, etc. where the number indicated is the ranking of that phase encode for overall acquisition. During the second segment the phase encodings read out would be 2, N+2, 2N+2, 3N+2, etc. In this way all desired phase encodings would be read out after N segments of acquisition, and the encodings within an individual segment would sample the master ranking monotonically and periodically.

Alternative means for performing segmentation are also possible and may be desirable according to the specific circumstances of the imaging task. In general, the advantages of the view orders described herein could be maintained to some degree for a segmented acquisition if the phase encodings within an individual segment were selected in any kind of monotonically increasing order from the ranked listing of all desirable phase encodings. That is to say, within any segment the ranking of one phase encoding measurement would in general be no smaller than the ranking of its predecessor measurement.

The subject techniques for ordering the phase encoding views, with or without segmentation, have been described for a general case. However, it should be clear that these methods can be used in conjunction with other well accepted techniques such as the use of RF preparatory pulses to create signal differences between materials, the use of administered contrast agents, or the use of dummy pulses prior to readout. Additionally, the subject orders can be applied repetitively in order to provide 3D image sets at multiple timepoints. For this situation of repetitive application of the phase encodings, it would also be possible to use partial updating of k-space from one reconstructed 3D image set to the next.

We claim:

1. A method for acquiring an NMR data set which is employed to reconstruct an image using a Fourier transformation, the steps comprising:

inputting image parameters which define the fields of view of the image along two axes;

producing a set of k-space sample points which identify the locations in k-space along said two axes which are to be sampled to produce an image with the defined fields of view;

ordering the k-space sample points in a list such that the k-space sample points closer to the origin of k-space are listed first;

performing an NMR pulse sequence in an NMR system to acquire sample NMR data for the NMR data set, the NMR pulse sequence including a first phase encoding gradient pulse having a magnitude which determines the location of the sample NMR data along a first of said two axes in k-space, and a second phase encoding gradient pulse having a magnitude which determines the location of the sample NMR data along a second of said two axes in k-space; and repeating the NMR pulse sequence to acquire sample NMR data for the NMR data set in the order indicated by said list.

2. The method as recited in claim 1 in which the k-space sample points are ordered by:

calculating a number for each k-space sample point which indicates the distance from the origin of k-space to the k-space sample point; and sorting the k-space sample points on the basis of their distance numbers.

3. The method as recited in claim 1 in which the k-space sample points are ordered by;

establishing a master array which defines all possible sample points in k-space and assigns a rank to each of said sample points; and sorting the k-space sample points on the basis of the rank of their corresponding sample point in the master array.

* * * * *